March 9, 1971 R. A. PERRICONE 3,568,312

METHOD OF MAKING PRINTED CIRCUIT BOARDS

Filed Oct. 4, 1968 2 Sheets-Sheet 1

INVENTOR
ROBERT A. PERRICONE
BY Roland I. Griffin
ATTORNEY

March 9, 1971 R. A. PERRICONE 3,568,312

METHOD OF MAKING PRINTED CIRCUIT BOARDS

Filed Oct. 4, 1968 2 Sheets-Sheet 2

INVENTOR

ROBERT A. PERRICONE

BY Roland I. Griffin

ATTORNEY

United States Patent Office 3,568,312

Patented Mar. 9, 1971

3,568,312

METHOD OF MAKING PRINTED CIRCUIT BOARDS

Robert A. Perricone, San Jose, Calif., assignor to Hewlett-Packard Company, Palo Alto, Calif.

Filed Oct. 4, 1968, Ser. No. 765,262
Int. Cl. H05k 3/06; B41m 3/08
U.S. Cl. 29—625 3 Claims

ABSTRACT OF THE DISCLOSURE

A foil clad substrate having holes therethrough is selectively etched to provide desired electrical circuit paths on both sides of the substrate. The substrate is coated with an electroless metal, and a metal coating is selectively deposited on the substrate and within the holes in the substrate to provide electrical interconnections between the circuit paths on both sides of the substrate. An encapsulant coating is then selectively deposited on the substrate to prevent the circuit paths from coming into contact with the surrounding environment.

BACKGROUND OF THE INVENTION

The present invention relates to an improved method of making printed circuit boards having conductive circuit paths on both sides of an insulating substrate and having plated-through-holes in the substrate for providing electrical interconnection between at least some of these circuit paths.

As the electronics industry, accustomed to using transistors and printed circuits, has introduced integrated circuits into printed circuit equipment, the requirements and tolerances of the line conductors and plated-through-hole connections have changed greatly. With the use of such small components as the dual-in-line integrated circuit package with its 0.100 inch lead spacing, the need for having the circuit paths run between such close leads has created a demand for a printed circuit board manufacturing process to produce fine circuit paths without sacrificing the requirements of good electrical isolation between paths and low resistance conductance along circuit paths. In addition, if thin circuit conductor paths can be produced, the amount of conductor metal used on the board can be reduced, thus saving conductor material costs and reducing the weight of the printed circuit board.

It is therefore an object of this invention to provide an improved method of making plated-through-hole printed circuit boards which will allow greater line conductor resolution, and thus provide for miniaturization and material savings, while providing good electrical interconnection between circuit paths on opposite sides of a board.

Formation of circuit board conductor traces while providing through-the-hole plating has traditionally been accomplished in one of two ways, pattern or panel plating. In pattern plating, the circuit "pattern" is defined by coating the board with a plating resist in a negative image of the desired circuit, usually immediately following an electroless copper deposition. Thus, just the actual circuit paths and through-the-hole connections are plated when the conductors are subsequently electro-plated. The problem is that plating builds up in all directions and the circuit paths widen twice as much as they build up, thus closing narrow circuit separations.

In the panel plating process, the entire board, including the holes, is plated following an electroless copper deposition. The circuit is then defined by plating on a resist in the required circuit pattern and etching away the large amount of unwanted plated conductor. The etching step results in complications, however, since etching must be done down through the entire thickness of the plated conductor to remove all the conductor between circuit paths allowing a great undercut of the conductor circuit metal. This can result in the production of ragged lines and flaking of the narrow traces of metal that describe the circuit. Metal slivers are often produced which become free and create short circuits across the board or components mounted upon it. Yet the amount of plating cannot be successfully reduced to avoid this deep undercutting since this will limit the metalization in the holes and thus produce a discontinuous circuit through them.

These unattractive alternative plating methods have thus created a need for an improved method of making printed circuit boards which will allow greater circuit conductor path resolution while providing a good low resistance electrical interconnection through the holes.

SUMMARY OF THE INVENTION

In accordance with the illustrated embodiment of the invention, a substrate clad on both sides with a thin layer of a metal foil such as copper and having holes therethrough is selectively etched to remove portions of the foil and thus form circuit paths on both sides of the substrate. The areas remaining foil clad represent the line conductors between terminals, the connection pads for external connection to the circuit board, and perhaps other areas where metal plating is desired such as small areas surrounding each hole in the substrate. Thus, essentially all portions of the insulated substrate which are to be electrically conductive in a designed circuit board pattern are now covered with metal foil.

Next a metal such as copper is electrolessly deposited on the substrate and within the holes. This provides an electrical path over the whole substrate and makes it possible to deposit a solid metal by electrolysis or any electrical deposition process on any area of the substrate. This is then accomplished by selectively depositing a metal such as copper on the substrate within the holes and in other areas where an additional buildup of metal may be desired for solder or connection terminals. Such a selective deposition may be made by coating the board with a plating resist in a negative image of the circuit portions which are to be heavily plated. In the preferred embodiment, this heavy metal plating is made through the holes and on pads on the face of the substrate surrounding each hole where a solder connection may later be desired on the board, on contact pads where the board will electrically connect with an outside circuit, and on other designated areas where an additional buildup of metal is desired. Finally, selective removal of the exposed electrolessly deposited copper from the substrate is required, since it is electrically conductive and the circuit paths must be electrically insulated. Lastly, the circuit board is selectively coated on both sides with an encapsulant, leaving exposed the areas with which electrical contact is to be made. The encapsulant prevents the circuitry from coming into contact with the environment surrounding the board and thus prevents contamination and oxidation.

There are several advantages to circuit boards produced according to this process over boards produced according to conventional methods. A major advantage of this process is the production of a printed circuit board having thin circuit traces in addition to having heavier plated-through-holes. Since the traces are merely etched in the thin foil on the original circuit board rather than plated, no growth in width of the traces results as in the pattern plating process. Also, since etching is done on the original thin foil, very little undercutting and flaking can result as would be the case in panel plating where a large amount of metal is etched away to remove all the undesired plating. Yet the present circuit board process provides good plated conductor areas where desired and good plated-through-connections through holes in the circuit board substrate.

Since most of the surfaces of the board may be covered with circuit traces, keeping the traces thin results in a large reduction in conductor material, thus lowering material costs and circuit board weight considerably. Not only are these primary metal costs and weights reduced, but since the greatest portion of the traces is encapsulated, less solder is collected when the board is dipped in the conventional fashion, thus also reducing secondary solder costs and weights. Most important, however, this process has allowed the production of narrow and closely-spaced circuit paths to reach the tolerances required with today's integrated circuit packages.

The use of an encapsulant on both sides of the board as a final step has several advantages. First, the encapsulant will keep solder to the areas exposed, thus lowering the amount of solder required and preventing bridging of circuit paths due to solder specks. Since the encapsulant covers all but the heavily plated areas of the board, moisture retardation results and the need for a moisture retarding spray after soldering is reduced or possibly eliminated. In addition, contamination of the board due to solder flux or board handling is also reduced while the surface insulation of the circuit is improved through the encapsulation.

DESCRIPTION OF THE PREFERRED EMBODIMENTS

Figure 1:
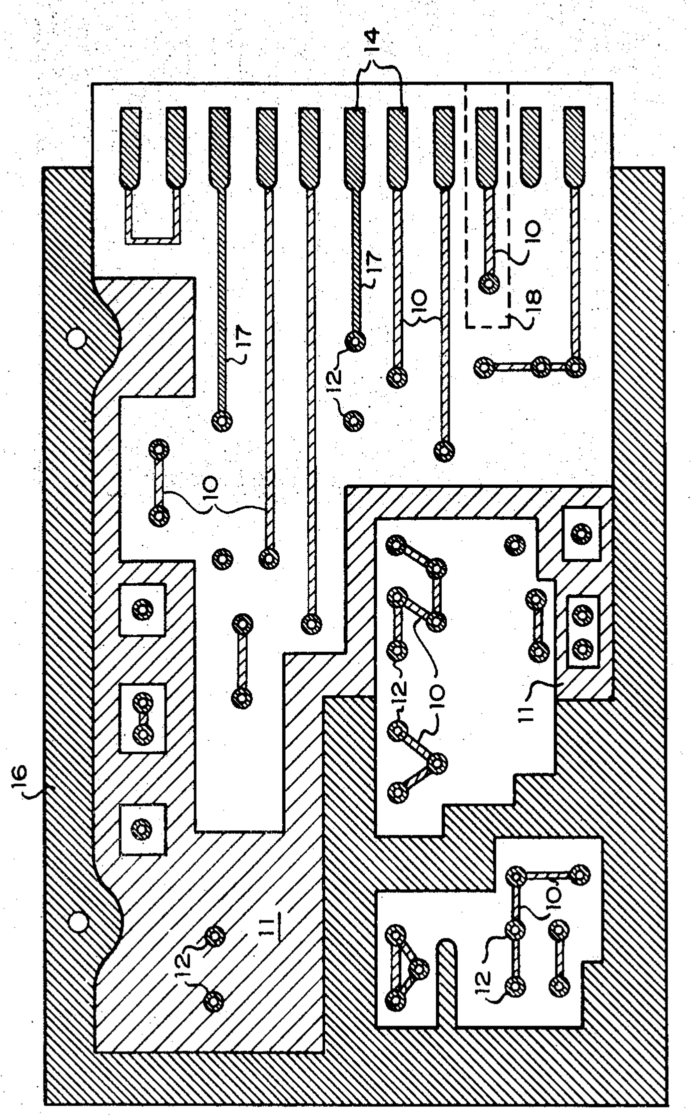
FIG. 1 is a drawing of one side of a printed circuit board produced according to the preferred embodiment of the method of the present invention.

Referring now to FIG. 1, there is shown a printed circuit board having thin etched circuit paths 10 of fine resolution, thin planar conductor areas 11, thick electroplated through-the-board connections 12, and thick electroplated areas such as contact fingers 14, ground plane 16, and thick circuit paths 17. A conformal encapsulant coating (not shown in FIG. 1) covers most of the board where no solder connections are to be made and oxidation and contamination are to be prevented.

Figure 2:
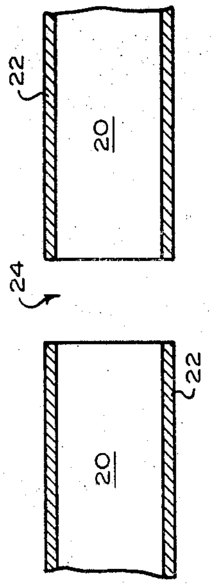

The inventive method of making the printed circuit board of FIG. 1 is best illustrated by referral to FIGS. 2 through 7 which illustrate the cross section of a portion of the circuit board shown in broken line box 18 of FIG. 1 through the various steps of the process. Referring now to FIG. 2 there is shown a substrate 20 of an insulating medium such as fiber glass which has been clad on both sides with a thin layer of metal foil 22. This clad substrate may be stock material having, for example, one ounce per square of copper with a foil thickness of approximately .0014 inch. The clad substrate has been sheared to the dimensions desired and punched and/or drilled to produce holes, such as 24, in the panel.

Figure 3:
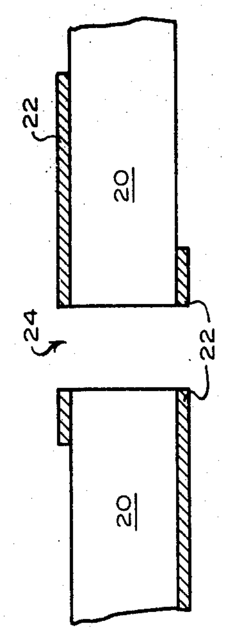

A panel so prepared is selectively etched to remove portions of the original foil 22 and form circuit paths on both sides of the substrate. This etching may be accomplished by using either silkscreen or photo-resist techniques, depending on the degree of resolution required, to print a positive image of the entire circuit with an etch-resist. Then the board is chemically etched to remove all the foil except the portions so coated. Upon removal of the etch-resist, the areas remaining foil clad, indicated as 22 in FIG. 3, represent the line conductor circuit paths 10, the base pads for contact fingers 14 shown in FIG. 1, and any other areas where a metal conductor is desired, such as ground plane 16 shown in FIG. 1 and small pad areas surrounding each plated-through substrate hole. Therefore, essentially all portions of the insulated substrate 20 which are to be electrically conductive in a desired circuit board pattern now remain covered with thin metal foil.

Figure 4:
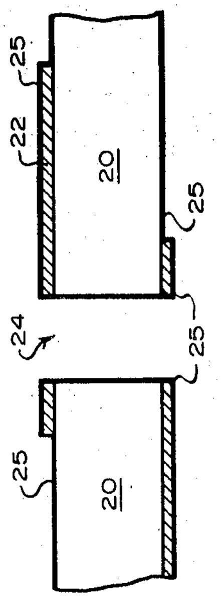

Next, after a possible sensitizing of the panel, a metal such as electroless copper 25 is electrolessly deposited on the whole substrate including the area within hole 24, as shown in FIG. 4. This is a thin deposition of perhaps 10 to 20 millionths of an inch and provides a continuous electrical path over the whole substrate and makes it possible to next deposit a solid metal by electrical deposition on any area of the panel.

Figure 5:
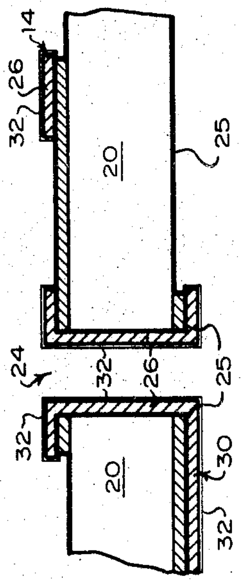
FIGS. 2 through 7 are cross-sectional views of a portion of the printed circuit board of FIG. 1 showing the various steps of the preferred embodiment of the method of the present invention.

FIG. 5 illustrates the deposition of such a metal 26, as for example, copper, on selected areas of the panel. This metal 26 is deposited in hole 24, and on selected areas of the panel where an additional buildup of metal will be required as for solder or connection terminals or to provide a ground plane layer of metal on the board. In FIG. 5 metal 26 is deposited on the illustrated areas to provide a contact finger 14, a thick conductor 30, and a pad surrounding and extending through hole 24 to facilitate the later soldering of a component lead in this hole. This selective deposition may be accomplished by using either silkscreen or photo-resist techniques to print a negative image of the circuit portions desired to be plated with a plating resist and by subsequent electrical plating deposition of metal 26 on the board so printed. Upon removal of the plating resist, these areas will be plated with metal 26 as illustrated in FIG. 5. After deposition of metal 26, which may be copper of a thickness of perhaps .002 inch, a thin coating of a dissimilar metal 32 may be deposited on top of metal 26 to protect the lower metal from oxidation and contamination. This dissimilar metal 32 may be, for example, tin, tin-nickel, or gold, and its thickness may be as small as 50 millionths of an inch.

Figure 6:
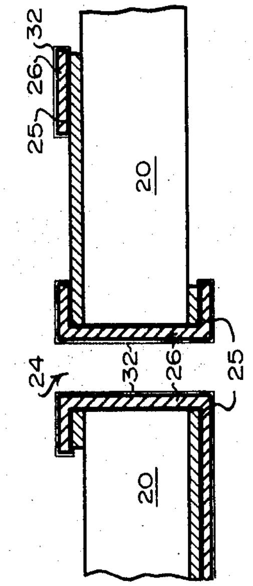
Figure 7:
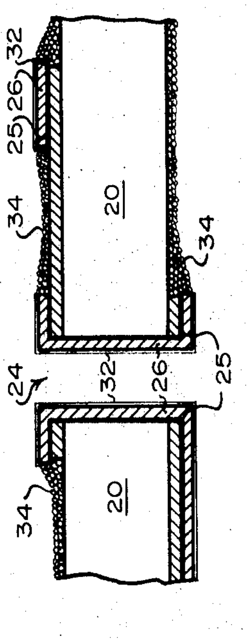

Finally the electroless coating 25 must be selectively removed from the panel areas not covered by metal 26 since it is electrically conductive and the circuit paths and holes must be electrically insulated. This is accomplished by etching the panel for a short time. Since the electroless metal 25 is very much thinner than the plated metal 26, an etch-resist may not even be required since a short etching will remove all of the exposed electroless metal 26 without harming the rest of the conductors. Or, as is usually the case, an etchant can be selected which will remove the electroless metal 25 while being resisted by the dissimilar metal 32 covering conductor metal 26. At this point in the process, as illustrated in FIG. 6, the panel has plated-through-holes and plated areas such as contact fingers but has thin etched circuit paths. To protect the thin exposed circuit path metal, a conformal encapsulant coating 34 is selectively deposited on both sides of the board leaving exposed only the areas with which electrical contact is to be made, as shown in FIG. 7. Encapsulant 34 serves several purposes. Besides acting as a solder resist, it prevents the circuitry from coming into contact with the environment surrounding the board and thus preventing oxidation and contamination.

What is claimed is:

1. A method of making printed circuits on a metal foil clad substrate having one or more holes therethrough, said method comprising in the order listed the steps of:

selectively removing portions of said foil from said substrate to form one or more circuit paths on said substrate;

depositing an electroless metal on said substrate, said circuit paths and within said holes;

selectively depositing a first metal coating on selected portions of said circuit paths and on said substrate within said holes to provide one or more electrically conductive paths through said substrate to selected ones of said circuit paths; and selectively removing portions of said electroless metal from said substrate.

2. A method as in claim 1 including an additional step of selectively depositing an encapsulant coating on said substrate and selected portions of said circuit paths subsequent to the selective removal of said electroless metal.

3. A method as in claim 1 including an additional step of selectively depositing a second metal coating, dissimilar from said first metal coating, on said first metal coating.

References Cited

UNITED STATES PATENTS

| | | | |
|---|---|---|---|
| 3,457,638 | 7/1969 | Johnson | 29—625 |
| 3,306,830 | 2/1967 | Bittrich et al. | 29—625UX |
| 3,268,653 | 8/1966 | McNutt | 39—625X |

FRANCIS S. HUSAR, Primary Examiner

U.S. Cl. X.R.

174—68.5